(12) United States Patent
Sze et al.

(10) Patent No.: US 9,515,116 B1
(45) Date of Patent: Dec. 6, 2016

(54) VERTICAL TRANSFER GATE STRUCTURE FOR A BACK-SIDE ILLUMINATION (BSI) COMPLEMENTARY METAL-OXIDE-SEMICONDUCTOR (CMOS) IMAGE SENSOR USING GLOBAL SHUTTER CAPTURE

(71) Applicant: Taiwan Semiconductor Manufacturing Co., Ltd., Hsin-Chu (TW)

(72) Inventors: Jhy-Jyi Sze, Hsin-Chu (TW); Alexander Kalnitsky, San Francisco, CA (US); Yimin Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/835,983

(22) Filed: Aug. 26, 2015

Related U.S. Application Data

(60) Provisional application No. 62/165,274, filed on May 22, 2015.

(51) Int. Cl.
    *H01L 31/0232* (2014.01)
    *H01L 27/146* (2006.01)

(52) U.S. Cl.
    CPC ..... *H01L 27/1464* (2013.01); *H01L 27/14623* (2013.01); *H01L 27/14629* (2013.01); *H01L 27/14638* (2013.01); *H01L 27/14654* (2013.01); *H01L 27/14689* (2013.01)

(58) Field of Classification Search
    CPC .......... H01L 27/1464; H01L 27/14689; H01L 27/14623; H01L 27/14629; H01L 27/14638; H01L 27/14654

USPC .......... 257/437, 292, 229, 228, 460, 48
See application file for complete search history.

(56) References Cited

U.S. PATENT DOCUMENTS

| | | | |
|---|---|---|---|
| 8,569,807 B2 * | 10/2013 | Chuang | H01L 27/14609 257/228 |
| 8,670,059 B2 * | 3/2014 | Ikeda | H01L 27/14609 250/206 |

(Continued)

OTHER PUBLICATIONS

An Aptina Technology White Paper. "Global Shutter Pixel Technologies and CMOS Image Sensors—A Powerful Combination." Mar. 2012.

(Continued)

*Primary Examiner* — Mohammed Shamsuzzaman
(74) *Attorney, Agent, or Firm* — Eschweiler & Associates, LLC

(57) ABSTRACT

A back-side illumination (BSI) complementary metal-oxide-semiconductor (CMOS) image sensor using a vertical transfer gate structure for improved quantum efficiency (QE) and global shutter efficiency (GSE) is provided. A semiconductor column extends vertically from a photodetector, towards a back-end-of-line (BEOL) stack. A floating diffusion region (FDR) is vertically spaced from the photodetector by the semiconductor column. The FDR comprises a sidewall surface laterally offset from a neighboring sidewall surface of the semiconductor column to define a lateral recess between the FDR and the photodetector. A gate dielectric layer lines the sidewall surface of the semiconductor column and is arranged in the lateral recess. A gate is arranged laterally adjacent to the gate dielectric layer and filling the lateral recess. Further, a method for manufacturing the vertical transfer gate structure is provided.

15 Claims, 14 Drawing Sheets

(56) References Cited

U.S. PATENT DOCUMENTS

| | | | |
|---|---|---|---|
| 8,735,797 B2* | 5/2014 | Yu | B82Y 15/00 250/214.1 |
| 2007/0092986 A1* | 4/2007 | Chen | H01L 27/14609 438/70 |
| 2008/0290441 A1* | 11/2008 | Hsu | H01L 27/14625 257/460 |
| 2009/0201400 A1* | 8/2009 | Zhang | H01L 27/14609 348/296 |
| 2009/0239327 A1* | 9/2009 | Oh | H01L 27/14609 438/59 |
| 2013/0143351 A1* | 6/2013 | Hynecek | H01L 27/14603 438/73 |
| 2013/0248862 A1* | 9/2013 | Inoue | H01L 31/0224 257/48 |
| 2013/0292750 A1* | 11/2013 | Chen | H01L 27/14612 257/291 |
| 2015/0145096 A1* | 5/2015 | Hsu | H01L 27/1464 257/460 |
| 2015/0155328 A1* | 6/2015 | Park | H01L 27/14645 250/208.1 |
| 2015/0179690 A1* | 6/2015 | Chien | H01L 27/1463 257/231 |
| 2015/0206917 A1* | 7/2015 | Chiu | H01L 27/14636 257/459 |
| 2015/0279899 A1* | 10/2015 | Kim | H01L 27/1463 250/208.1 |
| 2015/0372034 A1* | 12/2015 | Chen | H01L 27/14614 257/292 |
| 2016/0013240 A1* | 1/2016 | Jung | H01L 27/14645 257/292 |
| 2016/0043120 A1* | 2/2016 | Ahn | H01L 27/1463 257/229 |
| 2016/0086984 A1* | 3/2016 | Wang | H01L 27/1463 257/292 |

OTHER PUBLICATIONS

Microscopy Research Center. " Introductions to CMOS Sensors." May 14, 2015.

\* cited by examiner

VERTICAL TRANSFER GATE STRUCTURE FOR A BACK-SIDE ILLUMINATION (BSI) COMPLEMENTARY METAL-OXIDE-SEMICONDUCTOR (CMOS) IMAGE SENSOR USING GLOBAL SHUTTER CAPTURE

REFERENCE TO RELATED APPLICATION

This application claims the benefit of U.S. Provisional Application No. 62/165,274, filed on May 22, 2015, the contents of which are incorporated by reference in their entirety.

BACKGROUND

Many modern day electronic devices include image sensors. Image sensors include arrays of pixel sensors arranged in rows and columns, and logic devices supporting operation of the pixel sensor arrays. The pixel sensor arrays are configured to capture scenes and to convert the captured scenes to representative data. Some types of image capture include rolling shutter capture and global shutter capture. According to a rolling shutter capture, the rows or columns of an image sensor are sequentially activated to capture a set of strips collectively representing a scene. According to a global shutter capture, all the rows and columns of an image sensor are concurrently activated to capture a scene.

Some types of image sensors include charge-coupled device (CCD) image sensors, front side illumination (FSI) complementary metal-oxide-semiconductor (CMOS) image sensors, and back side illumination (BSI) CMOS image sensors. Compared to CCD image sensors, CMOS image sensors have lower power consumption, smaller size, direct digital output, and lower manufacturing cost. Further, compared to FSI CMOS image sensors, BSI CMOS image sensors have higher quantum efficiency and sensitivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
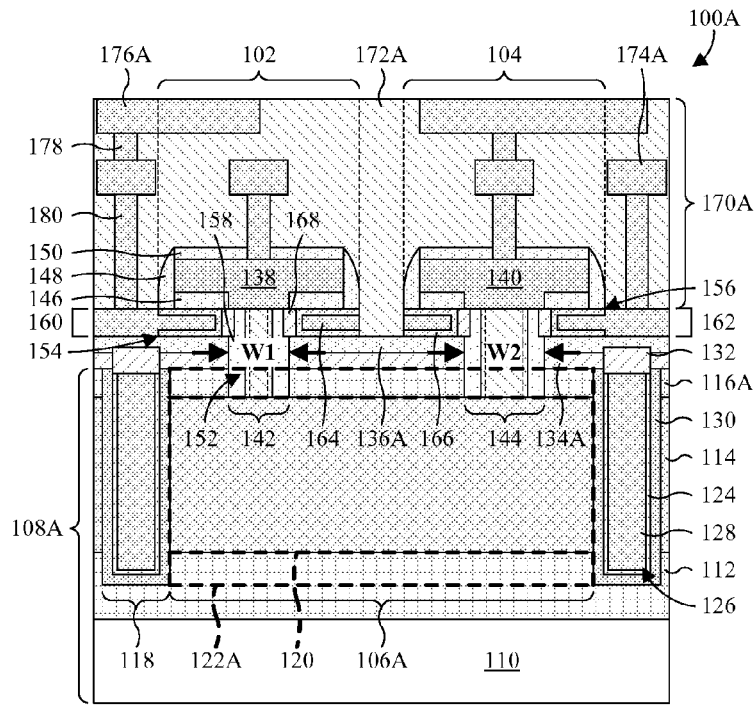
FIG. 1A illustrates a cross-sectional view of some embodiments of an integrated circuit (IC) having a pair of vertical transfer gate structures for a pixel sensor of a back-side illumination (BSI) complementary metal-oxide-semiconductor (CMOS) image sensor using global shutter capture.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some back side illumination (BSI) complementary metal-oxide-semiconductor (CMOS) image sensors include an array of pixels sensors arranged along a back side of an integrated circuit (IC), typically within a semiconductor substrate of the IC. The pixel sensors include corresponding photodetectors and corresponding transistors. The photodetectors accumulate charge from incident radiation (e.g., light), and the transistors facilitate readout of accumulated charge. Where the BSI CMOS image sensors use global shutter capture, the pixel sensors further include corresponding transfer transistors and corresponding floating diffusion regions (FDRs). The transfer transistors selectively transfer accumulated charge from the photodetectors to the FDRs, and the FDRs store transferred charge for readout.

Challenges with BSI CMOS image sensors employing global shutter capture stem from the FDRs. The FDRs are typically arranged laterally adjacent to the photodetectors on the backside of the IC. This reduces the fill factor (i.e., the size) of the photodetectors, and therefore reduces the quantum efficiency (QE) of the photodetectors. Further, the FDRs typically have a similar structure as the photodetectors, and therefore accumulate charge in response to incident radiation. Such accumulation can contaminate charge stored by the FDRs and can cause imaging artifacts. To prevent radiation from reaching and contaminating the FDRs, metal shields typically cover the FDRs on the back side of the IC. However, even with metal shields, much radiation typically reaches the FDRs and global shutter efficiency (GSE) (i.e., a measure of how well the FDRs are protected from radiation) is typically poor.

In view of the foregoing, the present application is directed to an IC having a vertical transfer gate structure to achieve improved QE and GSE in a BSI CMOS image sensor using global shutter capture. According to some embodiments of the IC, a semiconductor column extends vertically from a photodetector, towards a back-end-of-line (BEOL) stack. A FDR is vertically spaced from the photodetector and arranged on the semiconductor column, opposite the photodetector. The FDR comprises a sidewall surface laterally offset from a neighboring sidewall surface of the semiconductor column, away from the semiconductor column, to define a lateral recess between the sidewall surfaces. A gate dielectric layer lines the sidewall surface of the semiconductor column in the lateral recess, and a metal gate fills the lateral recess laterally adjacent to the gate dielectric layer.

By forming the FDR vertically spaced from the photodetector, the fill factor of the photodetector is increased, whereby the QE of the photodetector is advantageously increased. By arranging the metal gate laterally adjacent to the gate dielectric layer, and filling the lateral recess, the metal gate shields the FDR from radiation to advantageously improve GSE. Further, the metal gate reflects long wavelengths of radiation (e.g., greater than 530 nanometers) towards the photodetector to advantageously improve QE for long wavelengths of radiation. Beyond improvements in QE and GSE, the IC can advantageously be extended with an additional vertical transfer gate structure for anti-blooming.

With reference to FIG. 1A, a cross-sectional view 100A of some embodiments of an IC within which a pair of vertical transfer gate structures 102, 104 is arranged is provided. The vertical transfer gate structures 102, 104 find application in a pixel sensor of a BSI CMOS image sensor, and may improve QE and/or GSE. The vertical transfer gate structures 102, 104 include a readout vertical transfer gate structure 102 and an anti-blooming vertical transfer gate structure 104. The readout vertical transfer gate structure 102 facilitates readout of charge accumulated in a photodetector 106A underlying the vertical transfer gate structures 102, 104. The anti-blooming vertical transfer gate structure 104 facilitates removal of excess charge accumulated by the photodetector 106A to prevent blooming.

The IC comprises a semiconductor region 108A within which the photodetector 106A is arranged. The semiconductor region 108A comprises a semiconductor substrate 110 and, in some embodiments, one or more epitaxial layers 112, 114, 116A. The semiconductor substrate 110 may be, for example, a bulk semiconductor substrate, such as a bulk silicon substrate, or a silicon-on-insulator (SOI) substrate. The epitaxial layer(s) 112, 114, 116A are stacked upon one another over the semiconductor substrate 110. Further, the epitaxial layer(s) 112, 114, 116A may be, for example, a semiconductor material, such as silicon. In some embodiments, the semiconductor substrate 110 is a highly doped, p-type semiconductor substrate, and the epitaxial layer(s) 112, 114, 116A include an n-type epitaxial layer 114 and a pair of p-type epitaxial layers 112, 116A stacked on opposing sides of the n-type epitaxial layer 114.

The photodetector 106A is arranged in the semiconductor region 108A, laterally surrounded by an isolation region 118, and accumulates charge from incident radiation. The photodetector 106A may be, for example, a p-n photodiode or a p-i-n photodiode. The photodetector 106A includes a first detector region 120 arranged within the semiconductor region 108A to store accumulated charge. Further, the photodetector 106A includes a second detector region 122A arranged within the semiconductor region 108A, neighboring and, in some embodiments, abutting the first detector region 120, with an opposite doping type as the first detector region 120. In some embodiments, the first detector region 120 is an n-type doped region of the semiconductor region 108A, and the second detector region 122A is a p-type doped region of the semiconductor region 108A. For example, the first detector region 120 may correspond to a region of the n-type epitaxial layer 114 laterally surrounded by the isolation region 118, and the second detector region 122A may correspond to regions of the p-type epitaxial layers 112, 116A laterally surrounded by the isolation region 118.

The isolation region 118 laterally surrounds the photodetector 106A, and extends vertically into the semiconductor region 108A from over the semiconductor region 108A. The isolation region 118 may be, for example, a deep trench isolation (DTI) region, a shallow trench isolation (STI) region, or an implant isolation region. In some embodiments, the isolation region 118 includes a trench liner layer 124 lining a trench 126, and a trench filler layer 128 filling the trench 126. The trench liner layer 124 may be, for example, a dielectric, such as silicon dioxide, and the trench filler layer 128 may be, for example, polysilicon or oxide. Further, in some embodiments, the isolation region 118 includes a doped trench liner region or layer 130 lining the trench 126, and/or a trench cap layer 132 plugging the trench 126. The doped trench liner region or layer 130 may be a doped region of the semiconductor region 108 or a doped epitaxial layer. Further, the doped trench liner region or layer 130 may be, for example, doped with boron. The trench cap layer 132 may be, for example, a dielectric, such as silicon dioxide.

A pad layer 134A and, in some embodiments, a first etch stop layer 136A are stacked over the semiconductor region 108A. In some embodiments, the pad layer 134A laterally surrounds the trench cap layer 132, and/or has an upper surface recessed below an upper surface of the trench cap layer 132. The pad layer 134A may be, for example, a dielectric, such as silicon dioxide or some other oxide. Further, in some embodiments, the first etch stop layer 136A is arranged over the trench cap layer 132 and/or the pad layer 134A. The first etch stop layer 136A may be, for example, silicon nitride or some other nitride.

A readout FDR 138 and an anti-blooming FDR 140 corresponding to the vertical transfer gate structures 102, 104 are arranged over the pad layer 134A and, where present, the first etch stop layer 136A. The FDRs 138, 140 are doped epitaxial layers to store or otherwise dispose of charge transferred thereto from the photodetector 106A. For example, the FDRs 138, 140 may be non-epitaxial layers and/or may be highly doped with n-type dopants. In some embodiments, widths of the FDRs 138, 140 discretely taper towards widths of corresponding semiconductor columns 142, 144 underlying the FDRs 138, 140, such that the FDRs 138, 140 have T-shaped profiles. The discreet tapering defines lower surfaces extending laterally around the FDRs 138, 140, and being recessed above bottom surfaces of the FDRs 138, 140. In some embodiments, the lower surfaces are lined by corresponding second etch stop layers 146. Beyond the widths of the FDRs 138, 140, in some embodiments, sidewall surfaces of the FDRs 138, 140 are lined by corresponding spacer layers 148, and/or upper surfaces of the FDRs 138, 140 are lined by corresponding third etch stop layers 150. The second etch stop layers 146, the third etch stop layers 150, and the spacer layers 148 may be, for example, silicon nitride or some other nitride.

The semiconductor columns 142, 144 extend vertically from the FDRs 138, 140 to the first detector region 120. The semiconductor columns 142, 144 are doped to facilitate the transfer of charge from the first detector region 120 to the FDRs 138, 140. For example, the semiconductor columns 142, 144 may be doped with n- or p-type dopants. Further, the semiconductor columns 142, 144 are typically epitaxial layers. The semiconductor columns 142, 144 include inversion channel regions 152 (demarcated by thin dashed lines) for transfer transistors 154, 156. The inversion channel regions 152 extend vertically between the first detector region 120 and the FDRs 138, 140, along sidewall surfaces of the semiconductor columns 142, 144. Further, in some embodiments, the semiconductor columns 142, 144 include threshold adjustment regions 158 for the transfer transistors 154, 156. The threshold adjustment regions 158 extend vertically between the first detector region 120 and the FDRs 138, 140, along the sidewall surfaces of the semiconductor columns 142, 144, to vary the threshold voltages for the transfer transistors 154, 156. The threshold adjustment regions 158 are doped regions of the semiconductor columns 142, 144 with different dopants and/or doping concentrations than the remaining regions of the semiconductor columns 142, 144.

Widths W1, W2 of the semiconductor columns 142, 144 vary from the semiconductor column 142 corresponding to the readout FDR 138 to the semiconductor column 144 corresponding to the anti-blooming FDR 140, depending upon the anti-blooming design. However, the width W1 of the readout semiconductor column 142 is typically less than the width W2 of the anti-blooming semiconductor column 144. Further, the widths W1, W2 of the semiconductor columns 142, 144 vary to control the reflection of light away from the FDRs 138, 140. For example, the width W1 of the readout semiconductor column 142 may be, for example, less than or equal to about 0.2 micrometers to reflect long wavelength light (e.g., light with a wavelength greater than about 530 nanometers) away from the readout FDR 138.

The transfer transistors 154, 156 correspond to the vertical transfer gate structures 102, 104, and are arranged under the FDRs 138, 140 to selectively couple the FDRs 138, 140 to the first detector region 120. The transfer transistors 154, 156 include corresponding vertical transfer gates 160, 162 arranged over the pad layer 134A and, where present, the first etch stop layer 136A. Further, the vertical transfer gates 160, 162 laterally surround the semiconductor columns 142, 144. In some embodiments, the vertical transfer gates 160, 162 are confined under the FDRs 138, 140 and/or the spacer layers 148 on neighboring sides, while extending laterally past the FDRs 138, 140 and/or the spacer layers 148 on sides opposite the neighboring sides. The vertical transfer gates 160, 162 include corresponding gate filler layers 164 and, in some embodiments, corresponding gate liner layers 166. The gate filler layers 164 fill lateral recesses under the FDRs 138, 140 and define bodies of the vertical transfer gates 160, 162. The gate filler layers 164 may be, for example, a metal, such as tungsten. The gate liner layers 166 line the lateral recesses around the gate filler layers 164, and are confined to the lateral recesses. The gate liner layers 166 may be, for example, a metal, such as titanium nitride.

During use of the IC, the transfer transistors 154, 156 selectively transfer charge accumulated in the photodetector 106A to the FDRs 138, 140. For example, to facilitate readout of the photodetector 106A, charge accumulated in the readout FDR 138 is cleared and any residual charge in the readout FDR 138 is measured. Further, the accumulated charge in the photodetector 106A is transferred across the corresponding inversion channel region 152 to the readout FDR 138 by activating the readout transfer transistor 154. The readout transfer transistor 154 is activated by applying a voltage to the readout vertical transfer gate 160 that exceeds the threshold voltage for the readout transfer transistor 154. After a predetermined transfer period, the charge in the readout FDR 138 is measured again and the difference between the two measurements is calculated as the value for the photodetector 106A. As another example, to facilitate anti-blooming, charge accumulated in the photodetector 106A is transferred to the anti-blooming FDR 140 and cleared by activating the anti-blooming transfer transistor 156. The anti-blooming transfer transistor 154 is activated by applying a voltage to the anti-blooming vertical transfer gate 162 that exceeds the threshold voltage.

Gate dielectric layers 168 corresponding to the transfer transistors 154, 156 are arranged laterally between the semiconductor columns 142, 144 and the vertical transfer gates 160, 162. The gate dielectric layers 168 line the sidewall surfaces of the semiconductor columns 142, 144, and laterally surround the semiconductor columns 142, 144. Further, the gate dielectric layers 168 space the vertical transfer gates 160, 162 from the semiconductor columns 142, 144 and, in some embodiments, extend into the semiconductor columns 142, 144. The gate dielectric layers 168 may be, for example, an oxide, such as silicon dioxide, or a high κ dielectric (i.e., a dielectric layer with a dielectric constant greater than about 3.9).

A BEOL stack 170A is arranged over the FDRs 138, 140 and the transfer transistors 154, 156. The BEOL stack 170A includes an interlayer dielectric (ILD) layer 172A and metallization layers 174A, 176A stacked within the ILD layer 172A. The ILD layer 172A may be, for example, a low κ dielectric (i.e., a dielectric with a dielectric constant less than about 3.9) or an oxide. The metallization layers 174A, 176A are electrically coupled to one another by vias 178, and electrically coupled to the FDRs 138, 140 and the vertical transfer gates 160, 162 by contacts 180. The metallization layers 174A, 176A, the vias 178, and the contacts 180 may be, for example, a metal, such as aluminum copper, germanium, copper, or some other metal.

By forming the FDRs 138, 140 vertically spaced from the photodetector 106A, the fill factor of the photodetector 106A is increased and the QE of the photodetector 106A is increased. By arranging the vertical transfer gates 160, 162 under the FDRs 138, 140, the vertical transfer gates 160, 162 shield the FDRs 138, 140 from radiation to improve GSE. Further, the vertical transfer gates 160, 162 reflect long wavelengths of radiation towards the photodetector 106A to improve QE for long wavelength of radiation.

Figure 1B:
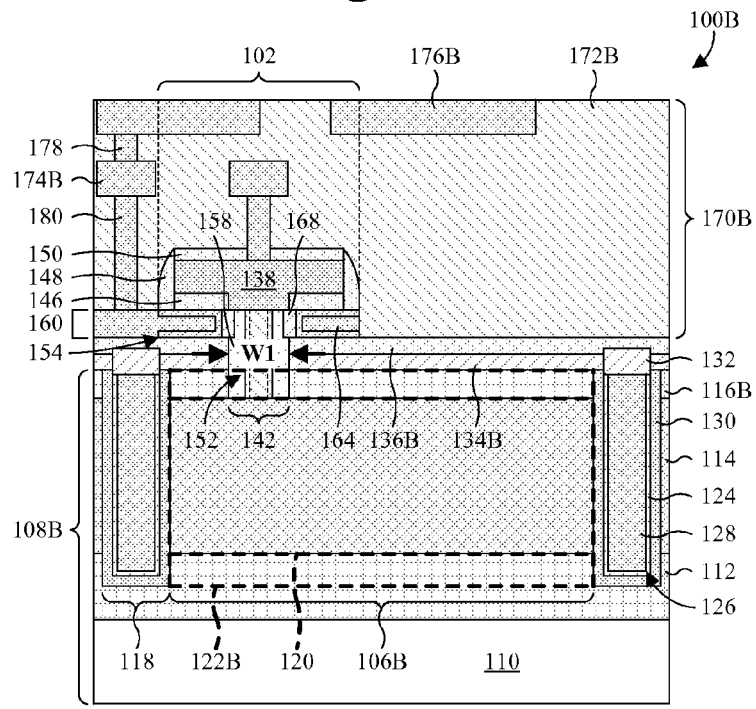
FIG. 1B illustrates a cross-sectional view of some embodiments of an IC having a single vertical transfer gate structure for a pixel sensor of a BSI CMOS image sensor using global shutter capture.

With reference to FIG. 1B, a cross-sectional view 100B of some embodiments of an IC within which a single vertical transfer gate structure 102 is arranged is provided. This to be contrasted with the cross-sectional view 100A of FIG. 1A, which had a pair of vertical transfer gate structures. The vertical transfer gate structure 102 finds application in a pixel sensor of a BSI CMOS image sensor, and may improve QE and/or GSE. Further, the vertical transfer gate structure 102 facilitates readout of charge accumulated in a photodetector 106B underlying the vertical transfer gate structure 102.

The photodetector 106B is arranged in a semiconductor region 108B, comprising a semiconductor substrate 110 and, in some embodiments, one or more epitaxial layers 112, 114, 116B. The photodetector 106 includes a first detector region 120 and a second detector region 122B. The second detector region 122B is arranged within the semiconductor region 108B, neighboring and, in some embodiments, abutting the first detector region 120, with an opposite doping type as the first detector region 120. In some embodiments, the first and second detector regions 120, 122B are respectively n- and p-type doped region of the semiconductor region 108B. For example, the first detector region 120 may correspond to a region of a n-type epitaxial layer 114 laterally surrounded by an isolation region 118, and the second detector region 122B may correspond to regions of p-type epitaxial layers 112, 116B laterally surrounded by the isolation region 118.

A BEOL stack 170B is arranged over the vertical transfer gate structure 102 and the semiconductor region 108B, vertically spaced by a pad layer 134B and, in some embodiments, a first etch stop layer 136B. The pad layer 134 and the first etch stop layer 136B may respectively be, for example, silicon dioxide and silicon nitride. The BEOL stack 170B includes an ILD layer 172B and metallization layers 174B, 176B stacked within the ILD layer 172B. The ILD layer 172B may be, for example, a low κ dielectric or an oxide. The metallization layers 174B, 176B are electrically coupled to one another by vias 178, and electrically coupled to an FDR 138 and a vertical transfer gate 160 by contacts 180. The metallization layers 174B, 176B, the vias 178, and the contacts 180 may be, for example, a metal, such as aluminum copper, germanium, copper, or some other metal.

Figure 2:
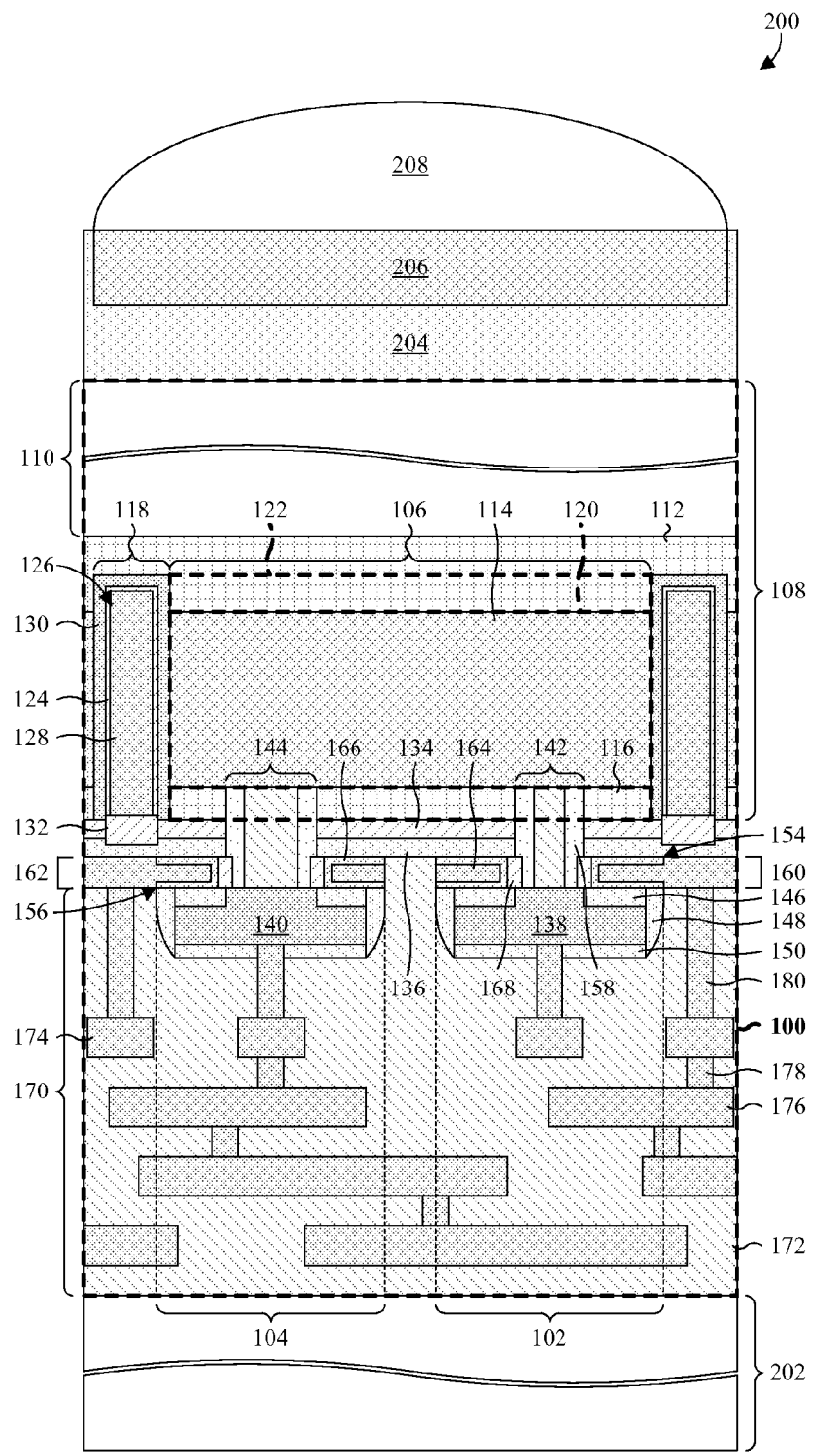
FIG. 2 illustrates a cross-sectional view of some embodiments of a pixel sensor of a BSI CMOS image sensor using global shutter capture.

With reference to FIG. 2, a cross-sectional view 200 of some embodiments of a pixel sensor of a BSI CMOS image sensor using global shutter capture is provided. The pixel sensor includes an IC 100 according to FIG. 1A or B (illustrated with FIG. 1A). The IC 100 is arranged over a carrier substrate 202 and bonded to the carrier substrate 202 through a BEOL stack 170 of the IC 100. Relative to the cross-sectional views 100A, 100B of FIGS. 1A & B, the IC 100 is rotated about 180 degrees. The carrier substrate 202 may be, for example, a bulk semiconductor substrate, such as a bulk silicon substrate, or a SOI substrate.

The BEOL stack 170 is arranged over the carrier substrate 202, and includes an ILD layer 172 and metallization layers 174, 176 stacked within the ILD layer 172. The ILD layer 172 may be, for example, a low κ dielectric or an oxide. The metallization layers 174, 176 are electrically coupled to one another by vias 178, and electrically coupled to one or more overlying FDRs 138, 140 and one or more overlying vertical transfer gates 160, 162 by contacts 180. The metallization layers 174, 176, the vias 178, and the contacts 180 may be, for example, a metal, such as aluminum copper, germanium, copper, or some other metal.

A semiconductor region 108 is arranged over the BEOL stack 170, the FDR(s) 138, 140, and the vertical transfer gate(s) 160, 162, vertically spaced by a pad layer 134 and, in some embodiments, a first etch stop layer 136. The pad layer 134 and the etch stop layer 136 may respectively be, for example, silicon dioxide and silicon nitride. The semiconductor region 108 comprises a semiconductor substrate 110 and, in some embodiments, one or more epitaxial layers 112, 114, 116 underlying the semiconductor substrate 110.

A photodetector 106 is arranged in a semiconductor region 108, over the pad layer 134 and, where present, the first etch stop layer 136. The photodetector 106 includes a first detector region 120 and a second detector region 122. The second detector region 122 is arranged within the semiconductor region 108, neighboring and, in some embodiments, abutting the first detector region 120, with an opposite doping type as the first detector region 120. In some embodiments, the first and second detector regions 120, 122 are respectively n- and p-type doped region of the semiconductor region 108. For example, the first detector region 120 may correspond to a region of a n-type epitaxial layer 114 laterally surrounded by an isolation region 118, and the second detector region 122 may correspond to regions of p-type epitaxial layers 112, 116 laterally surrounded by the isolation region 118.

A passivation layer 204 is arranged over the IC 100, along a back side of the IC 100, and a color filter 206 and a micro lens 208 are stacked over the passivation layer 204. The passivation layer 204 may be, for example, a single layer of nitride or oxide or a multi-layer film comprising an oxide-nitride-oxide stack. The color filter 206 is assigned a color or wavelength of radiation (e.g., light), and is configured to transmit the assigned color or wavelength of radiation to the photodetector 106. Typically, the color filter assignment is one of red, green, and blue. In some embodiments, the color filter 206 has a planar upper surface that is approximately coplanar with an upper surface of the passivation layer 204, such that the color filter 206 is buried in the passivation layer 204. The micro lens 208 is arranged over the color filter 206, and configured to focus incident radiation towards the photodetector 106 and/or the color filter 206.

Figure 3:
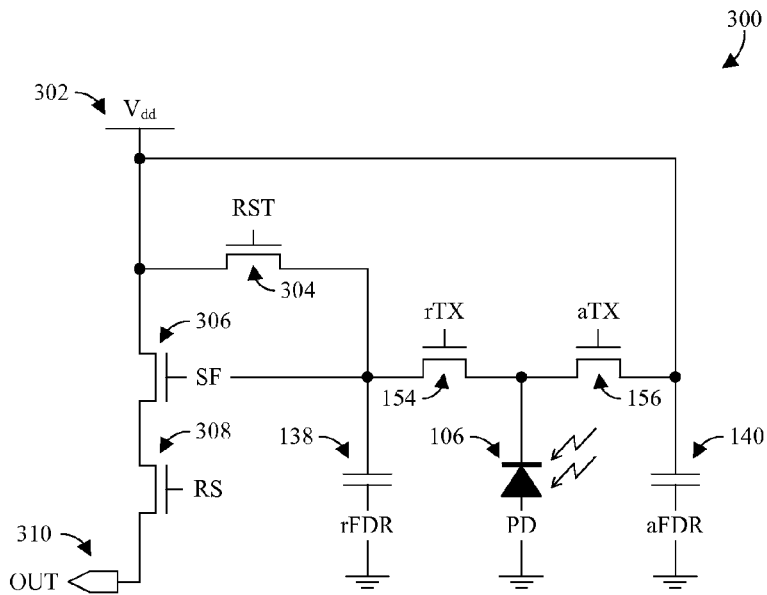
FIG. 3 illustrates a circuit diagram of some embodiments of a pixel sensor of a BSI CMOS image sensor using global shutter capture.

With reference to FIG. 3, a circuit diagram 300 for some embodiments of a pixel sensor of a BSI CMOS image sensor using global shutter capture is provided. The pixel sensor includes a photodetector 106 electrically coupled to a readout FDR 138 (modeled as a capacitor) and, in some embodiments, an anti-blooming FDR 140 (modeled as a capacitor). The photodetector 106 is electrically coupled to the readout FDR 138 by a readout transfer transistor 154 that selectively transfers charge from the photodetector 106 to the readout FDR 138. Further, where the anti-blooming FDR 140 is present, the photodetector 106 is electrically coupled to the anti-blooming FDR 140 by an anti-blooming transfer transistor 156. The anti-blooming transfer transistor 156 selectively transfers charge from the photodetector 106 to the anti-blooming FDR 140, where the charge is cleared by a power source 302 connected to the anti-blooming FDR 140.

The readout FDR 138 is electrically coupled to the power source 302 through a reset transistor 304, and electrically coupled to the gate of a source follower transistor 306. The reset transistor 304 selectively clears charge stored at the readout FDR 138 by connecting the readout FDR 139 to the power source 302. The source follower transistor 306 converts the charge stored at the readout FDR 138 into a voltage. The source follower transistor 306 is connected between the power source 302 and a row select transistor 308. The row select transistor 308 corresponds to a row in a pixel sensor array, and selectively connects the voltage from the source follower transistor 306 to an output 310.

During use of the pixel sensor, the pixel sensor is exposed to radiation for a predetermined exposure period. In some embodiments, before the exposure begins, charge accumulated in the photodetector 106 is cleared by activating the anti-blooming transfer transistor 156. Over the exposure period, the photodetector 106 records the intensity of incident radiation by accumulating charge proportional to the intensity of the radiation. After the exposure period, the accumulated charge is readout. In some embodiments, the accumulated charge is readout by momentarily activating the reset transistor 304 to clear the charge stored at the readout FDR 138. Thereafter, the row select transistor 308 and the readout transfer transistor 154 are activated for a predetermined transfer period, thereby transferring charge to the readout FDR 138. At the beginning and the end of the predetermined transfer period, the voltage at the output 310 is measured. The intensity of the recorded radiation is then calculated as the difference in the measurements.

Figure 4:
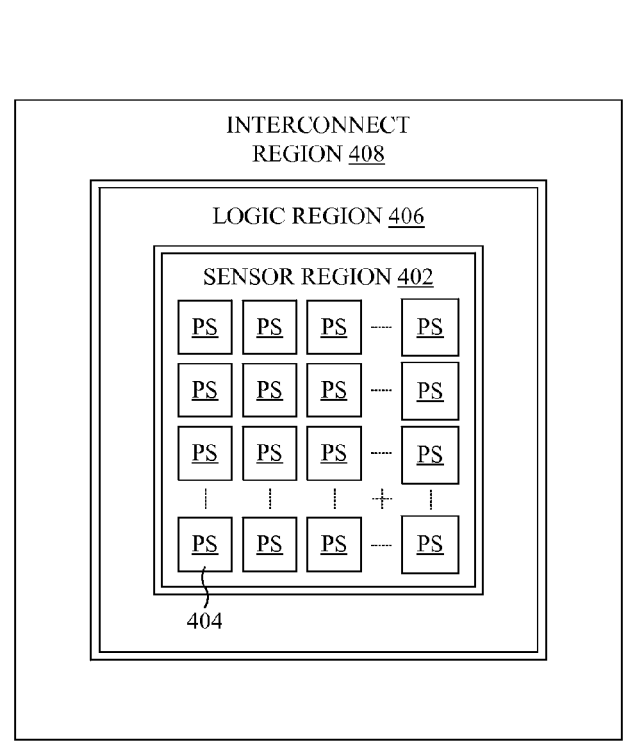
FIG. 4 illustrates a plan view of some embodiments of a BSI CMOS image sensor using global shutter capture.

With reference to FIG. 4, a plan view 400 of some embodiments of a BSI CMOS image sensor using global shutter capture is provided. The BSI CMOS image sensor includes a sensor region 402, with which an array of pixel sensors 404 are arranged in rows and columns. The pixel sensors 404 may, for example, correspond to the pixel sensor of FIG. 2 or 3. Further, the BSI CMOS image sensor includes logic and interconnect regions 406, 408 laterally surrounding the sensor region 402. The logic region 406 includes logic supporting operation of the pixel sensor array, such as logic supporting readout of the pixel sensor array. The interconnect region 408 laterally surrounds the logic region 406, and includes pad structures for connecting the BSI CMOS image sensor to external devices.

Figure 5:
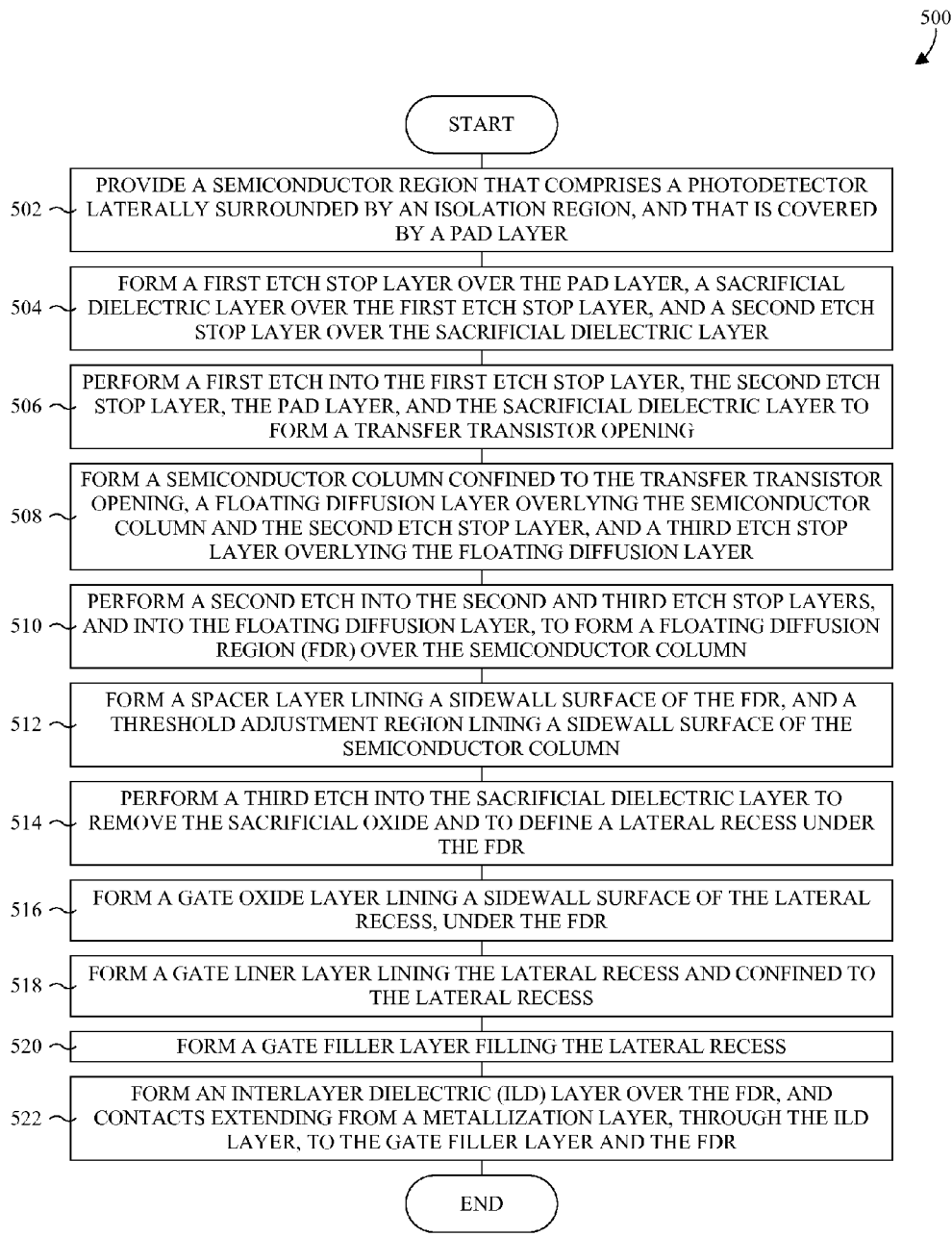
FIG. 5 illustrates a flowchart of some embodiments of a method of manufacturing an IC having a vertical transfer gate structure for a pixel sensor of a BSI CMOS image sensor using global shutter capture.

With reference to FIG. 5, a flowchart 500 provides some embodiments of a method for manufacturing an IC having a vertical transfer gate structure for a pixel sensor of a BSI CMOS image sensor using global shutter capture.

At 502, a semiconductor region is provided. The semiconductor region comprises a photodetector laterally surrounded by an isolation region, and is covered by a pad layer.

At 504, a first etch stop layer is formed over the pad layer, a sacrificial dielectric layer is formed over the first etch stop layer, and a second etch stop layer is formed over the sacrificial dielectric layer.

At 506, a first etch is performed into the first etch stop layer, the second etch stop layer, the pad layer, and the sacrificial dielectric layer to form a transfer transistor opening.

At 508, a semiconductor column is formed confined to the transfer transistor opening, a floating diffusion layer is formed overlying the semiconductor column and the second etch stop layer, and a third etch stop layer is formed overlying the floating diffusion layer.

At 510, a second etch is performed into the second and third etch stop layers, and into the floating diffusion layer, to form a FDR over the semiconductor column. By forming the FDR vertically spaced from the photodetector, the fill factor of the photodetector may be increased, whereby the QE of the photodetector is advantageously increased.

At 512, a spacer layer is formed lining a sidewall surface of the FDR, and a threshold adjustment region is formed lining a sidewall surface of the semiconductor column.

At 514, a third etch is performed into the sacrificial dielectric layer to remove the sacrificial oxide and to define a lateral recess under the FDR.

At 516, a gate oxide layer is formed lining a sidewall surface of the lateral recess, under the FDR.

At 518, a gate liner layer is formed lining the lateral recess and confined to the lateral recess.

At 520, a gate filler layer is formed filling the lateral recess. By arranging the gate liner and filler layers adjacent to the gate dielectric layer, and vertically between the FDR and the photodetector, the FDR is shielded from radiation to advantageously improve GSE. Further, the long wavelengths of radiation (e.g., greater than 530 nanometers) are reflected towards the photodetector to advantageously improve QE for long wavelengths of radiation.

At 522, an ILD layer is formed over the FDR, and contacts are formed extending from a metallization layer, through the ILD layer, to the gate filler layer and the FDR.

The vertical transfer gate structure is typically directed towards readout of the photodetector. In some embodiments, the method can advantageously be extended to form an additional vertical transfer gate structure for anti-blooming in parallel with the vertical transfer gate structure for readout. In such embodiments, the anti-blooming design is controlled through the dimensions of the vertical transfer gate structures.

While the disclosed method (e.g., the method described by the flowchart 500) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6-24, cross-sectional views of some embodiments of an IC having a vertical transfer gate structure at various stages of manufacture are provided to illustrate the method of FIG. 5. Although FIGS. 6-24 are described in relation to the method of FIG. 5, it will be appreciated that the structures disclosed in FIGS. 6-24 are not limited to the method of FIG. 5, but instead may stand alone as structures independent of the method of FIG. 5. Similarly, although the method of FIG. 5 is described in relation to FIGS. 6-24, it will be appreciated that the method of FIG. 5 is not limited to the structures disclosed in FIGS. 6-24, but instead may stand alone independent of the structures disclosed in FIGS. 6-24.

Figure 6:
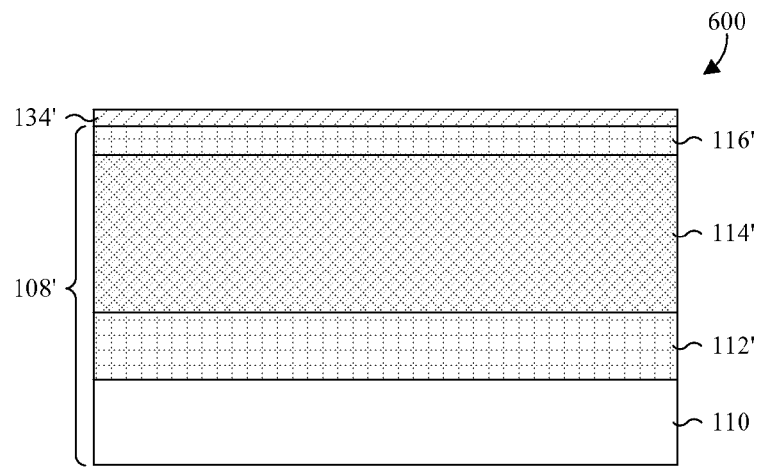
FIGS. 6-24 illustrate a series of cross-sectional views of some embodiments of an IC having a vertical transfer gate structure at various stages of manufacture, according to the method of FIG. 5.
Figure 7:
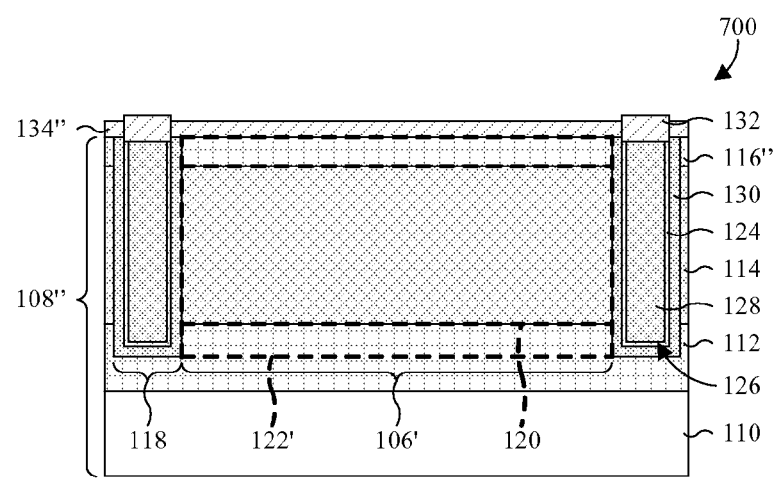

FIGS. 6 and 7 illustrate cross-sectional views 600, 700 of some embodiments corresponding to Act 502.

As illustrated by FIG. 6, a semiconductor region 108' and a pad oxide layer 134' are provided or otherwise formed. The semiconductor region 108' comprises a semiconductor substrate 110 and, in some embodiments, one or more epitaxial layers 112', 114', 116' arranged over the semiconductor substrate 110. The epitaxial layer(s) 112', 114', 116' are stacked over the semiconductor substrate 110, and may be sequentially formed by, for example, an epitaxial growth process. In some embodiments, the epitaxial layer(s) 112', 114', 116' include an n-type epitaxial layer 114' and a pair of p-type epitaxial layers 112', 114' stacked on opposing sides of the n-type epitaxial layer 114'. The pad oxide layer 134' overlies the semiconductor region 108' and may be formed by, for example, vapor deposition (e.g., chemical vapor deposition (CVD)), thermal oxidation, spin coating, or any other suitable deposition technique.

As illustrated by FIG. 7, an isolation region 118 is formed extending into the semiconductor region 108' (see FIG. 6) from over the semiconductor region 108'. In some embodiments, the isolation region 118 extends into the epitaxial layer(s) 112', 114', 116' (see FIG. 6). For example, the isolation region 118 may extend through one 116' of the p-type epitaxial layers 112', 116', through the n-type epitaxial layer 114', and into the other one 112' of the p-type epitaxial layers 112', 116'. Further, the isolation region 118 is formed laterally surrounding a photodetector region of the semiconductor region 108'.

In some embodiments, the process for forming the isolation region 118 includes forming a pad nitride layer over the pad oxide layer, and forming a first trench cap layer over the pad nitride layer. Thereafter, an etch is performed into the semiconductor region 108' to form a trench 126 laterally surrounding the photodetector region. The trench 126 is cleaned and, in some embodiments, a doped trench liner region or layer 130 is formed lining the trench 126 by epitaxy or ion implantation. A trench liner layer 124 is grown lining the trench 126, and a trench filler layer 128 is formed filling the trench 126 and overlying the first trench cap layer. An etch is performed to etch back the trench filler layer 128, and a second trench cap layer 132 is formed in the trench 126, and over the first trench cap layer. A chemical mechanical polish (CMP) is performed into the first and second trench cap layers 132 to remove the first trench cap layer, and an etch is performed into the pad nitride layer to remove the pad nitride layer.

After forming the isolation region 118, a remaining semiconductor region 108" is covered by a remaining pad oxide layer 134", and includes the isolation region 118 laterally surrounding a photodetector 106'. The isolation region 118 may be, for example, a DTI region. The photodetector 106' includes a first detector region 120 arranged within the remaining semiconductor region 108" to store accumulated charge. Further, the photodetector 106' includes a second detector region 122' arranged within the remaining semiconductor region 108", neighboring the first detector region 120, with an opposite doping type as the first detector region 120. In some embodiments, the first detector region 120 corresponds to a region of a remaining n-type epitaxial layer 114 laterally surrounded by the isolation region 118, and the second detector region 122' corresponds to regions of remaining p-type epitaxial layers 112, 116" laterally surrounded by the isolation region 118.

Figure 8:
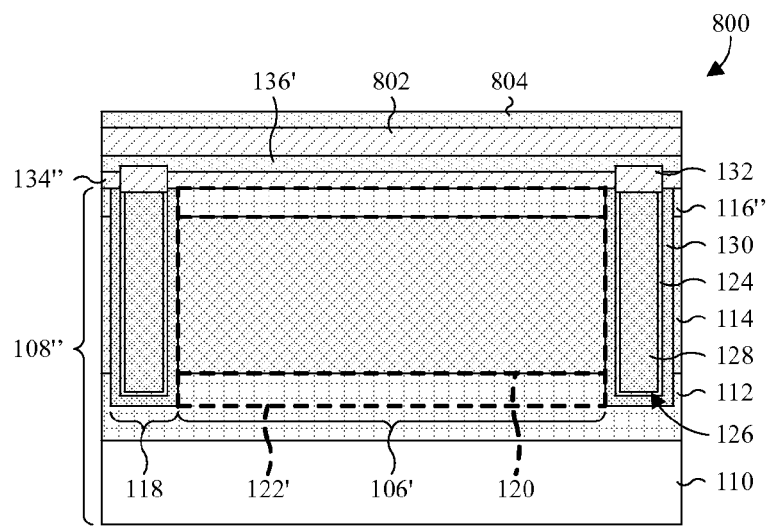

FIG. 8 illustrates a cross-sectional view 800 of some embodiments corresponding to Act 504. As illustrated, a first etch stop layer 136' is formed over the pad oxide layer 134" and the isolation region 118, a sacrificial dielectric layer 802 is formed over the first etch stop layer 136', and a second etch stop layer 804 is formed over the sacrificial dielectric layer 802. In some embodiments, the first and second etch stop layers 136', 804 and the sacrificial dielectric layer 802 are sequentially formed using vapor deposition, thermal oxidation, spin coating, or any other suitable deposition technique. The sacrificial dielectric layer 802 may be formed as, for example, an oxide or as some other dielectric.

Figure 9:
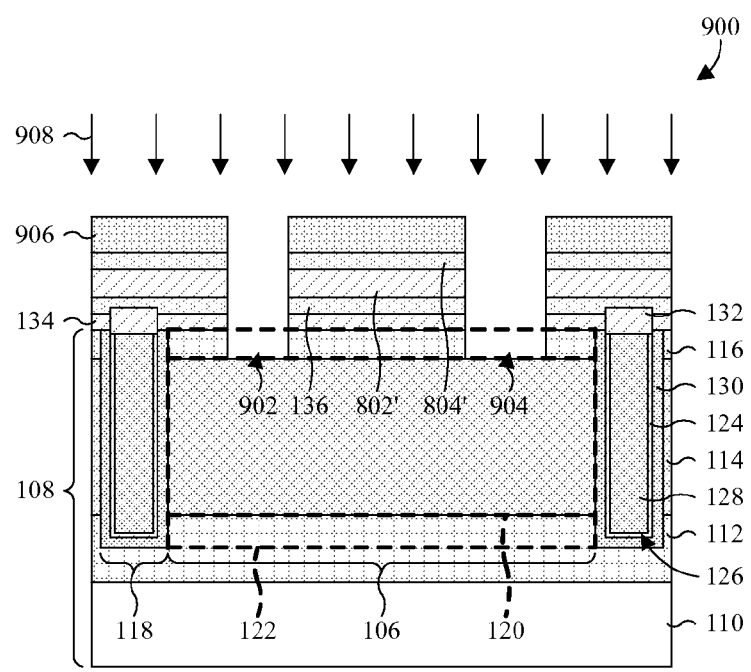

FIG. 9 illustrates a cross-sectional view 900 of some embodiments corresponding to Act 506. As illustrated, a first etch is performed to the first detector region 120, through select regions of the first and second etch stop layers 136', 804 (see FIG. 8), the sacrificial and pad oxide layers 134", 802 (see FIG. 8), and the semiconductor region 108" (see FIG. 8). The first etch results in one or more transfer gate openings 902, 904 exposing the first detector region 120 in remaining first and second etch stop layers 136', 804', remaining pad and sacrificial dielectric layers 134, 802', and a remaining semiconductor region 108. The transfer gate opening(s) 902, 904 include a transfer gate opening 902 for a readout vertical transfer gate structure. A width of the readout transfer gate opening 902 may be, for example, less than or equal to about 0.2 micrometers. Further, in some embodiments, the transfer gate opening(s) 902, 904 include a transfer gate opening 904 for an anti-blooming vertical transfer gate structure. A width of the anti-blooming transfer gate opening 904 is typically greater than the width of the readout transfer gate opening 902. Advantageously, by controlling the widths or other dimensions of the transfer gate opening(s) 902, 904, an anti-blooming design can be readily implemented.

In some embodiments, the process for performing the first etch includes forming a first photoresist layer 906 masking regions of the second etch stop layer 804 laterally surrounding the select regions. Further, one or more first etchants 908 may be applied to the first and second etch stop layers 136', 804, the sacrificial dielectric layer 802, the pad oxide layer 134", and the semiconductor region 108" according to a pattern of the first photoresist layer 906. Thereafter, the first photoresist layer 906 may be removed.

Figure 10:
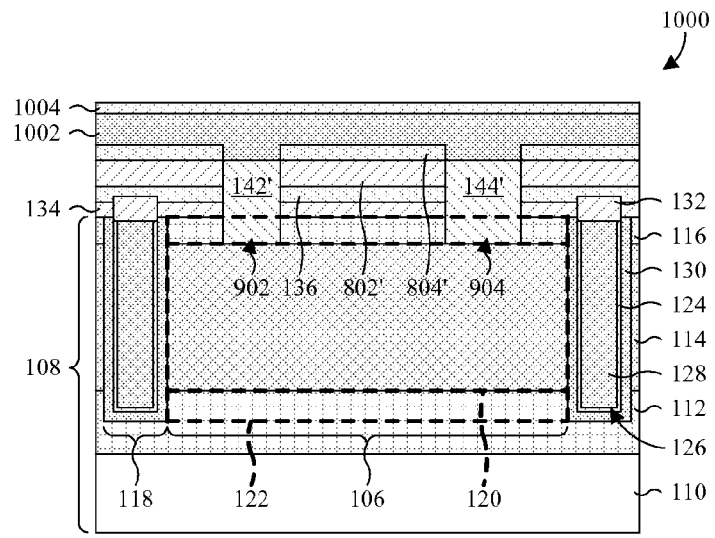

FIG. 10 illustrates a cross-sectional view 1000 of some embodiments corresponding to Act 508. As illustrated, one or more semiconductor columns 142', 144' corresponding to the transfer gate opening(s) 902, 904 are formed partially filling the transfer gate opening(s) 902, 904. Further, the semiconductor column(s) 142', 144' are formed confined to the transfer gate opening(s) 902, 904 and with an n or p doping type. The semiconductor column(s) 142', 144' may be formed using, for example, a selected epitaxial growth process.

Also illustrated by FIG. 10, a floating diffusion layer 1002 and a third etch stop layer 1004 are formed. The floating diffusion layer 1002 is formed as an epitaxial and/or semiconductor layer filling a remainder of the transfer gate opening(s) 902, 904, over the semiconductor column(s) 142', 144' and the second etch stop layer 804'. Further, in some embodiments, the floating diffusion layer 1002 is formed highly doped (relative to the semiconductor column(s) 142', 144') with an n or p doping type. The floating diffusion layer 1002 may be formed using, for example, a selected non-epitaxial growth process. The third etch stop layer 1004 is formed over the floating diffusion layer 1002 using, for example, vapor deposition, spin coating, or any other suitable deposition technique.

Figure 11:
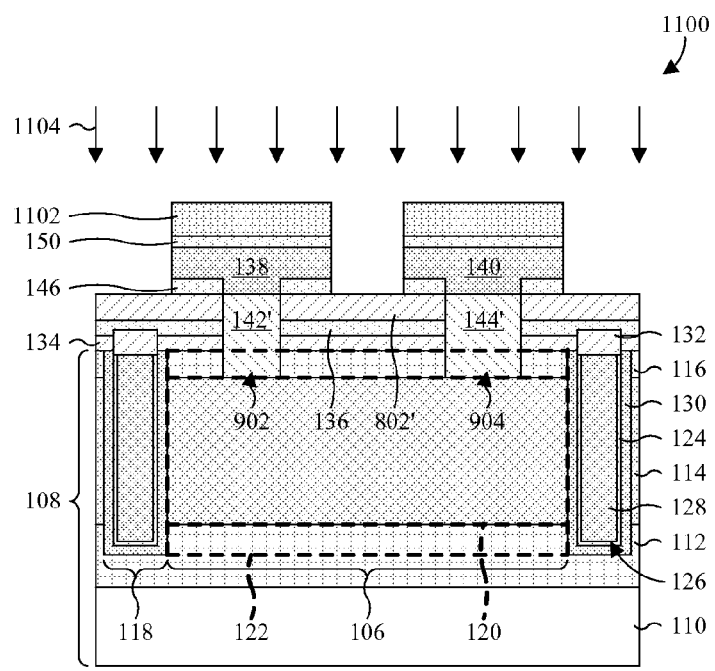

FIG. 11 illustrates a cross-sectional view 1100 of some embodiments corresponding to Act 510. As illustrated, a second etch is performed into the second and third etch stop layers 804', 1004 (see FIG. 10) and the floating diffusion layer 1002 (see FIG. 10), through select regions. The second etch results in one or more FDRs 138, 140 corresponding to the semiconductor column(s) 142', 144'. The FDR(s) 138, 140 overly the semiconductor column(s) 142', 144' and have sidewall surfaces laterally offset away from neighboring sidewall surfaces of the semiconductor column(s) 142', 144'. The second etch further divides the second and third etch stop layers 804', 1004 into sublayers 146, 150 individual to the FDR(s) 138, 140.

In some embodiments, the process for performing the second etch may include forming a second photoresist layer 1102 masking regions of the third etch stop layer 1004 laterally surrounded by the select regions. Further, one or more second etchants 1104 may be applied to the second and third etch stop layers 804', 1004, as well as the floating diffusion layer 1002, according to a pattern of the second photoresist layer 1102. Typically, the second etch stop layer 804' is used as an etch stop when etching through the floating diffusion layer 1002. Thereafter, the second photoresist layer 1102 may be removed.

Figure 12:
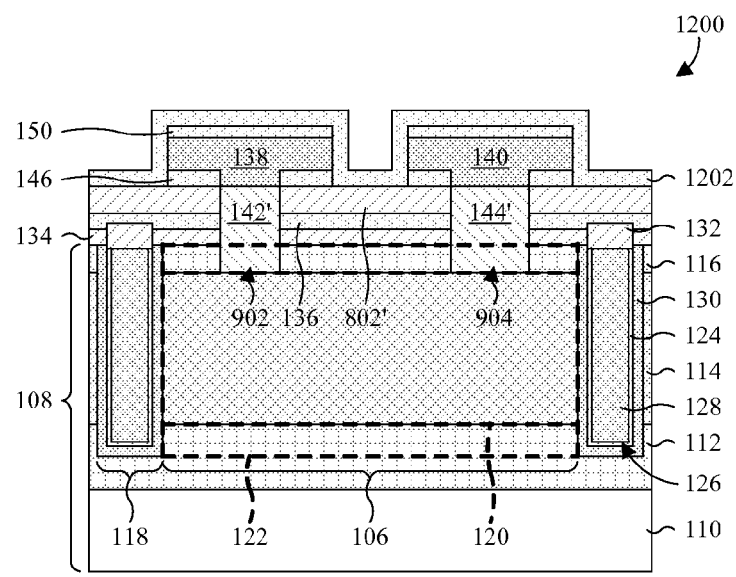
Figure 13:
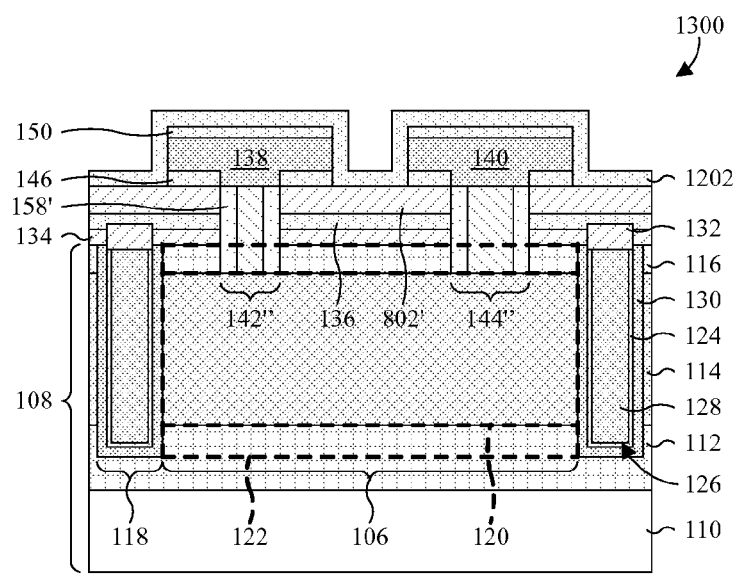
Figure 14:
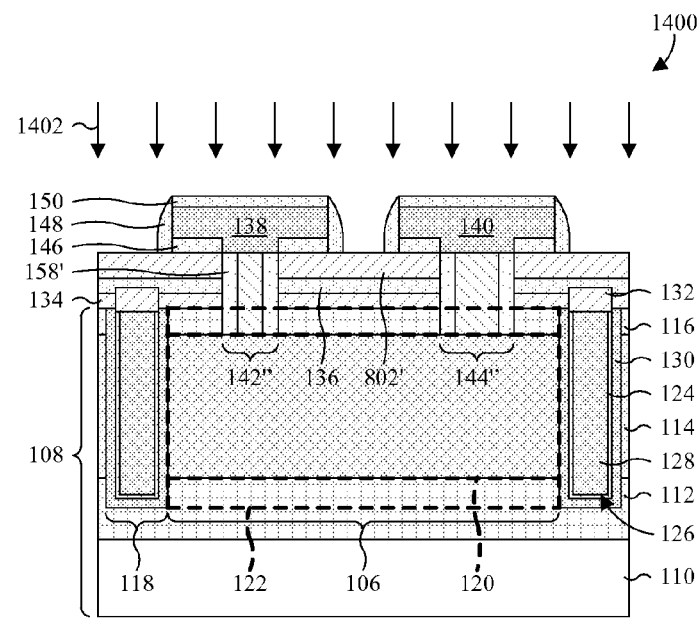

FIGS. 12-14 illustrate cross-sectional views 1200, 1300, 1400 of some embodiments corresponding to Act 512.

As illustrated by FIG. 12, a spacer layer 1202 is formed lining the FDR(s) 138, 140 and the sacrificial dielectric layer 802'. Typically, the spacer layer 1202 is conformally formed. The spacer layer 1202 may be formed using, for example, vapor deposition, thermal oxidation, spin coating, or any other suitable deposition technique.

As illustrated by FIG. 13, dopants are implanted into the semiconductor column(s) 142', 144' (see FIG. 12). The implantation results in one or more remaining semiconductor columns 142', 144' comprising one or more corresponding threshold adjustment regions 158'. The threshold adjustment region(s) 158' extend vertically between the first detector region 120 and the FDR(s) 138, 140, along the sidewall surfaces of the remaining semiconductor column(s)

142', 144'. The threshold adjustment region(s) 158' vary the threshold voltages for one or more transfer transistors under manufacture.

As illustrated by FIG. 14, a third etch is performed into the spacer layer 1202 (see FIG. 13). The second etch removes lateral stretches of the spacer layer 1202, and divides the spacer layer 1202 into one or more sublayers 148 individual to the FDR(s) 138, 140 and confined to sidewall surfaces. In some embodiments, the process for performing the third etch may include applying a third etchant 1402 to the spacer layer 1202.

Figure 15:
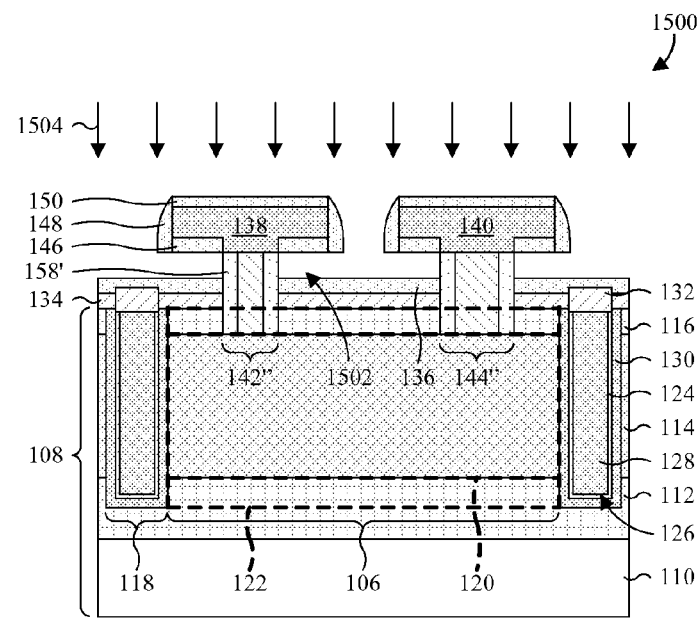

FIG. 15 illustrates a cross-sectional view 1500 of some embodiments corresponding to Act 514. As illustrated, a fourth etch is performed into the sacrificial dielectric layer 802' (see FIG. 14) to remove the sacrificial dielectric layer 802'. The fourth etch results in one or more lateral recesses 1502 underlying corresponding ones of the FDR(s) 138, 140. In some embodiments, the process for performing the fourth etch may include applying one or more fourth etchants 1504 to the sacrificial dielectric layer 802'. Typically, during the fourth etch, the first etch stop layer 136 acts as an etch stop. Further, the second and third etch stop layers 146, 150, as well as the spacer layer(s) 148, mask and protect the FDR(s) 138, 140.

Figure 16:
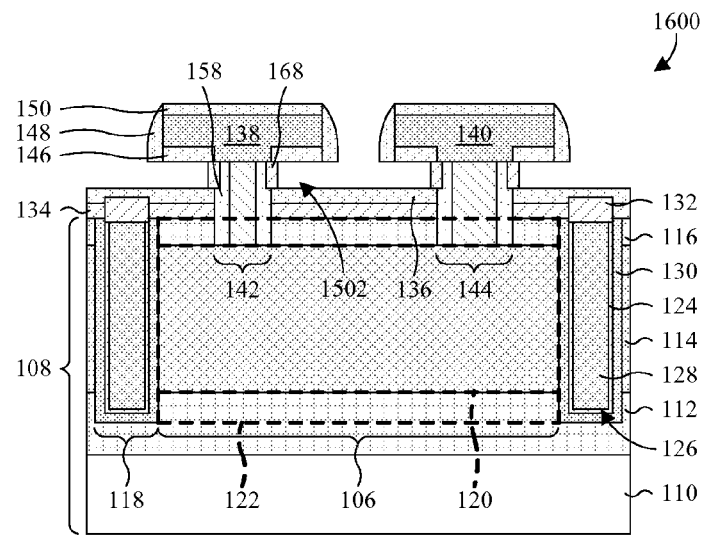

FIG. 16 illustrates a cross-sectional view 1600 of some embodiments corresponding to Act 516. As illustrated, one or more gate dielectric layers 168 corresponding to the semiconductor column(s) 142", 144" (see FIG. 15) are formed lining sidewall surfaces of the semiconductor column(s) 142", 144" in the lateral recess(es) 1502. Further, in some embodiments, the gate dielectric layer(s) 168 are formed partially in the semiconductor column(s) 142", 144" and the threshold adjustment region(s) 158', such that the formation results in one or more remaining semiconductor column(s) 142, 144, and one or more remaining threshold adjustment regions 158, comprising the gate dielectric layer(s) 168. The gate oxide layer(s) 168 may be formed using, for example, thermal oxidation.

Figure 17:
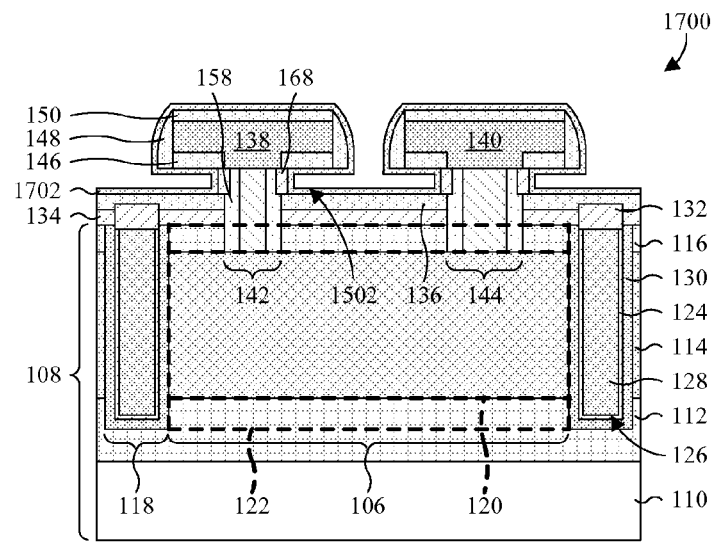
Figure 18:
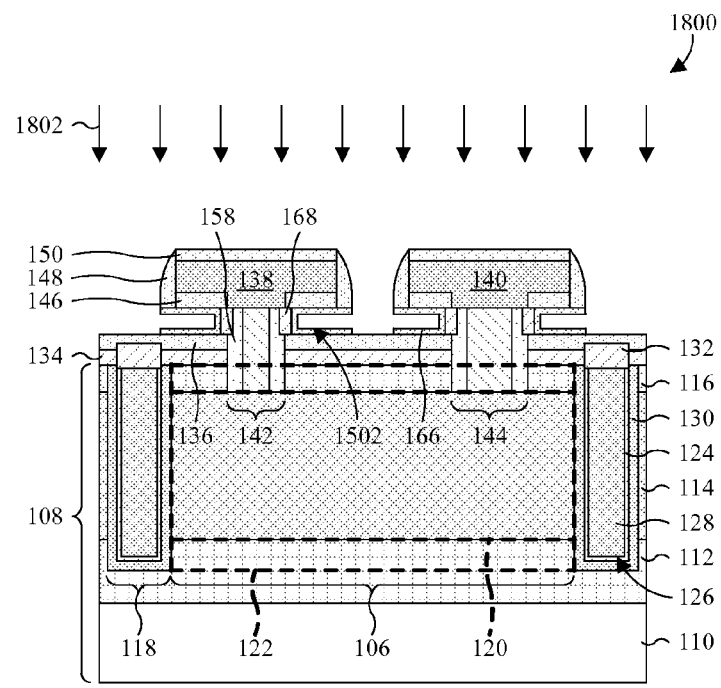

FIGS. 17 and 18 illustrate cross-sectional views 1700, 1800 of some embodiments corresponding to Act 518.

As illustrated by FIG. 17, a gate liner layer 1702 is formed lining the lateral recess(es), 1502, the etch stop layers 136, 146, 150, and the spacer layer(s) 148. Typically, the gate liner layer 1702 is conformally formed. The gate liner layer 1702 may be formed using, for example, vapor deposition, thermal oxidation, spin coating, or any other suitable deposition technique.

As illustrated by FIG. 18, a fifth etch is performed into the gate liner layer 1702 (see FIG. 17) to etch back to the gate liner layer 1702. The fifth etch divides the gate liner layer 1702 into one or more sublayers 166 individual to the lateral recess(es) 1502 and confined to the lateral recess(es) 1502. In some embodiments, the process for performing the fifth etch may include applying a fifth etchant 1802 to the gate liner layer 1702. Typically, during the fifth etch, the first etch stop layer 136 acts as an etch stop. Further, the second and third etch stop layers 146, 150, as well as the spacer layer(s) 148, mask and protect the FDR(s) 138, 140.

Figure 19:
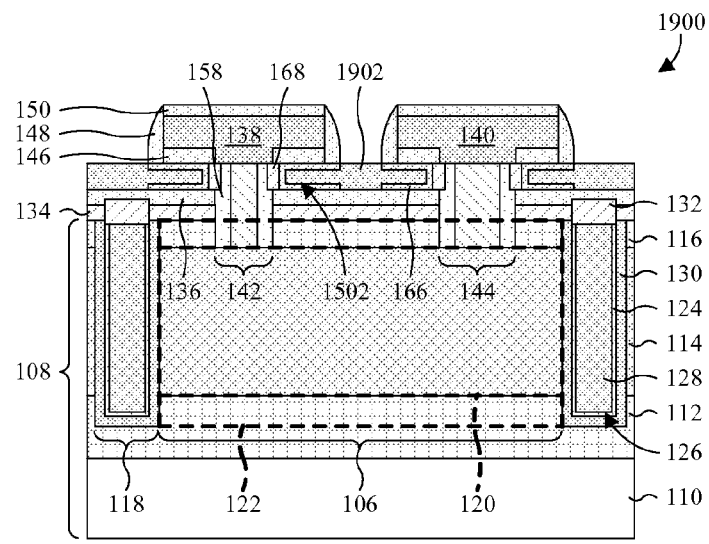
Figure 20:
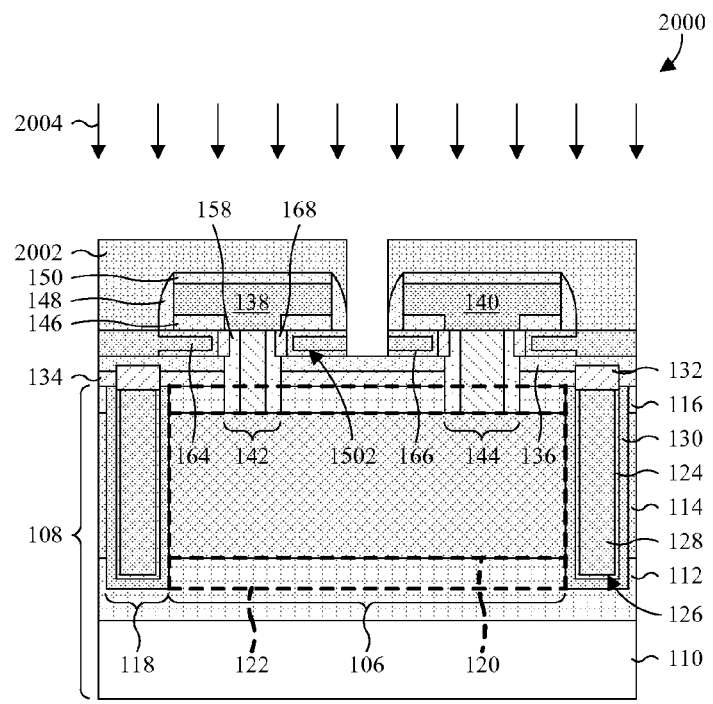

FIGS. 19 and 20 illustrate cross-sectional views 1900, 2000 of some embodiments corresponding to Act 520.

As illustrated by FIG. 19, a gate filler layer 1902 is formed filling the lateral recess(es) 1502. The gate filler layer 1902 may be formed using, for example, a selected metal growth or any other suitable deposition technique. Typically the gate filler layer 1902 is formed with an upper surface substantially even with a lower surface of the second etch stop layer(s) 146.

As illustrated by FIG. 20, a sixth etch is performed into the gate filler layer 1902 (see FIG. 19), through select regions. The sixth etch divides the gate filler layer 1902 into one or more sublayers 164 individual to the semiconductor column(s) 142, 144. The sublayer(s) 164 are typically confined under the FDR(s) 138, 140 on neighboring sides, and typically extend laterally beyond the FDR(s) 138, 140 on sides opposite the neighboring sides.

In some embodiments, the process for performing the sixth etch may include forming a third photoresist layer 2002 masking regions of the gate filler layer 1902 laterally surrounding the select regions. Further, one or more sixth etchants 2004 may be applied to the gate filler layer 1902 according to a pattern of the third photoresist layer 2002. Typically, the first etch stop layer 136 is used as an etch stop when etching through the gate filler layer 1902. Thereafter, the third photoresist layer 2002 may be removed.

FIGS. 21-24 illustrate cross-sectional views 2100, 2200, 2300, 2400 of some embodiments corresponding to Act 522.

Figure 21:
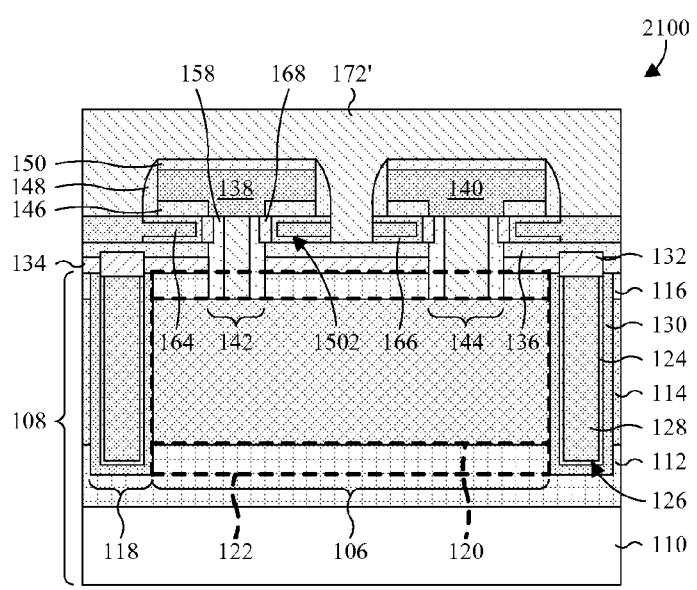

As illustrated by FIG. 21, an ILD layer 172' is formed with a planar upper surface over the FDR(s) 138, 140 and the semiconductor region 108. The process for forming the ILD layer 172' may include depositing the ILD layer 172' and performing a CMP and/or an etch back into the ILD layer 172'.

Figure 22:
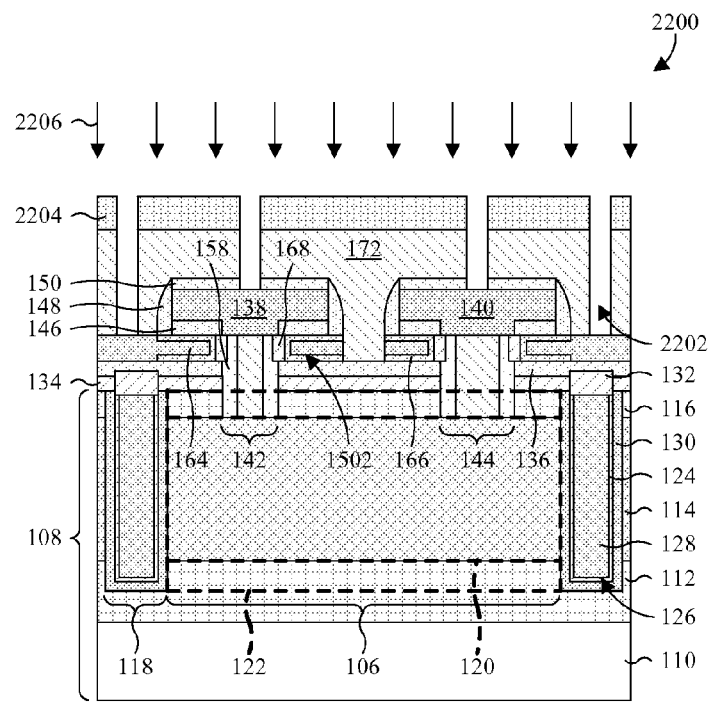

As illustrated by FIG. 22, a seventh etch is performed into select regions of the ILD layer 172' (see FIG. 21). The seventh etch results in a remaining ILD layer 172 with contact openings 2202 exposing the gate filler layer(s) 164 and the FDR(s) 138, 140. In some embodiments, the process for performing the seventh etch may include forming a fourth photoresist layer 2204 masking regions of the ILD layer 172' laterally surrounding the select regions. Further, one or more seventh etchants 2206 may be applied to the ILD layer 172' according to a pattern of the fourth photoresist layer 2204. Typically, the third etch stop layer(s) 150 are used as etch stops when etching through the ILD layer 172'. Thereafter, the fourth photoresist layer 2204 may be removed.

Figure 23:
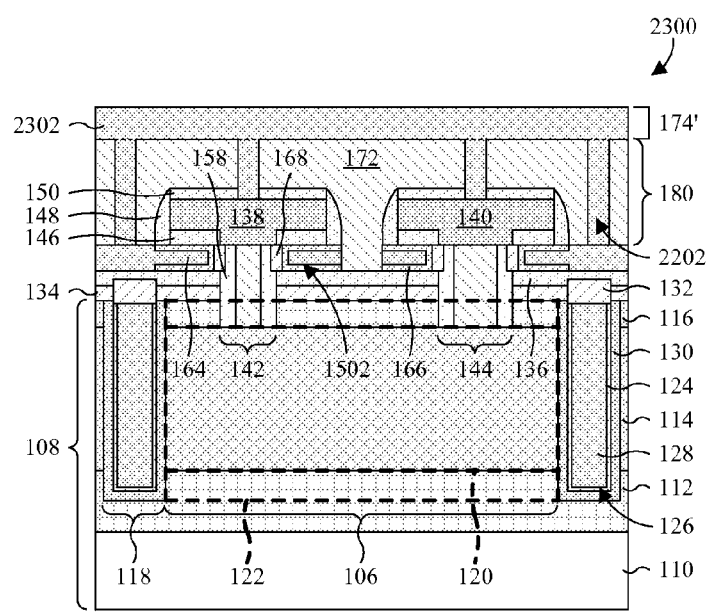

As illustrated by FIG. 23, a metal layer 2302 is formed with a planar upper surface, over the ILD layer 172 and filling the contact openings 2202. The metal layer 2302 includes a metallization layer 174' and contacts 180 electrically coupling the metallization layer 174' to the gate filler layer(s) 164 and the FDR(s) 138, 140. The process for forming the metal layer 2302 may include depositing the metal layer 2302 using, for example, vapor deposition, spin coating, or any other suitable deposition technique. Thereafter, a CMP may be performed into the metal layer 2302.

Figure 24:
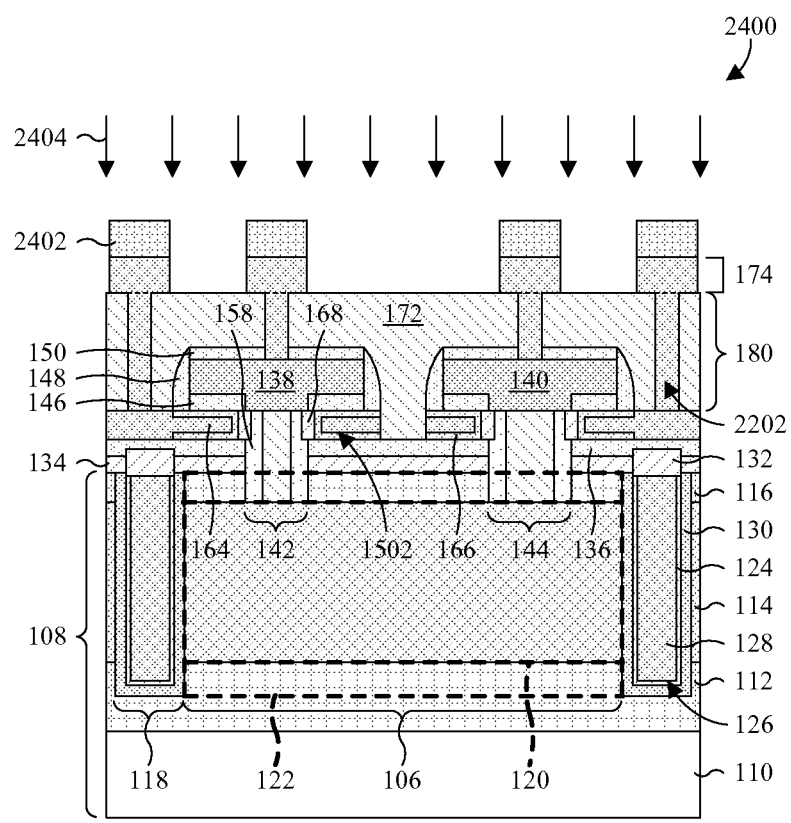

As illustrated by FIG. 24, an eighth etch is performed into select regions of the metal layer 2302 (see FIG. 23). The eighth etch results in a remaining metal layer 2302' including a remaining metallization layer 174 electrically coupled to the gate filler layer(s) 164 and the FDR(s) 138, 140 by the contacts 180. In some embodiments, the process for performing the eighth etch may include forming a fifth photoresist layer 2402 masking regions of the metal layer 2302 laterally surrounding the select regions. Further, one or more eighth etchants 2404 may be applied to the metal layer 2302 according to a pattern of the fifth photoresist layer 2402. Thereafter, the fifth photoresist layer 2402 may be removed.

Thus, as can be appreciated from above, the present disclosure provides a BSI image sensor. A semiconductor column extends vertically from a photodetector, towards a BEOL stack. A FDR is vertically spaced from the photodetector by the semiconductor column. The FDR comprises a sidewall surface laterally offset from a neighboring sidewall surface of the semiconductor column to define a lateral recess between the FDR and the photodetector. A gate dielectric layer lines the sidewall surface of the semiconductor column and is arranged in the lateral recess. A gate is arranged laterally adjacent to the gate dielectric layer and fills the lateral recess.

In other embodiments, the present disclosure provides a method for manufacturing a BSI image sensor. A sacrificial dielectric layer is formed over a semiconductor region. A first etch is performed into the sacrificial dielectric layer to form an opening exposing a photodetector in the semiconductor region. A semiconductor column is formed in the opening. A FDR is formed over the semiconductor column and the sacrificial dielectric layer. A second etch is performed into the sacrificial dielectric layer to remove the sacrificial dielectric layer, and to form a lateral recess between the FDR and the photodetector. A gate is formed filling the lateral recess and laterally spaced from the semiconductor column by a gate dielectric layer.

In yet other embodiments, the present disclosure provides a BSI image sensor. A BEOL stack is arranged over a carrier substrate. A semiconductor region is arranged over and spaced from the BEOL stack. The semiconductor region comprises a photodetector. A pair of semiconductor columns extend vertically from the photodetector, towards the BEOL stack. A pair of FDRs are vertically spaced from the photodetector and correspondingly abut the semiconductor columns, opposite the photodetector. The FDRs comprise sidewall surfaces laterally offset away from neighboring sidewall surfaces of the corresponding semiconductor columns. A pair of gate dielectric layers line the sidewall surfaces of the semiconductor columns and are arranged laterally between the sidewall surfaces of the semiconductor columns and the FDRs. A pair of gates are arranged laterally adjacent to the gate dielectric layers, and vertically between the FDRs and the photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illumination (BSI) image sensor comprising:
   a semiconductor column extending vertically from a photodetector, towards a back-end-of-line (BEOL) stack;
   a T-shaped floating diffusion region (FDR) vertically spaced from the photodetector by the semiconductor column, wherein the T-shaped FDR comprises a sidewall surface laterally offset from a neighboring sidewall surface of the semiconductor column to define a lateral recess between the T-shaped FDR and the photodetector;
   a gate dielectric layer lining the sidewall surface of the semiconductor column and arranged in the lateral recess;
   a gate arranged laterally adjacent to the gate dielectric layer and filling the lateral recess, wherein the gate comprises a metal gate liner layer confined to the lateral recess and lining the lateral recess, wherein the gate further comprises a metal gate filler layer filling the lateral recess, and wherein the T-shaped FDR overhangs the gate; and
   an etch stop layer interposed between the gate and a lower surface of the T-shaped FDR within the lateral recess.

2. The BSI image sensor according to claim 1, wherein the T-shaped FDR abuts the semiconductor column, opposite the photodetector, and wherein the T-shaped FDR has a larger footprint than the semiconductor column.

3. The BSI image sensor according to claim 1, further comprising:
   a semiconductor region abutting the semiconductor column, opposite the T-shaped FDR, wherein the photodetector is arranged in the semiconductor region and is laterally surrounded by an isolation region.

4. The BSI image sensor according to claim 1, wherein the semiconductor column has a width less than or equal to about 0.2 micrometers.

5. The BSI image sensor according to claim 1, wherein the T-shaped FDR is an n-type epitaxial layer, and wherein the semiconductor column is an n- or p-type epitaxial layer.

6. The BSI image sensor according to claim 1, further comprising:
   a second semiconductor column extending vertically from the photodetector, towards the BEOL stack;
   a second T-shaped FDR vertically spaced from the photodetector by the second semiconductor column, wherein the second T-shaped FDR comprises a sidewall surface laterally offset from a neighboring sidewall surface of the second semiconductor column to define a second lateral recess between the second T-shaped FDR and the photodetector;
   a second gate dielectric layer lining the sidewall surface of the second semiconductor column and arranged in the second lateral recess; and
   a second gate arranged laterally adjacent to the second gate dielectric layer and filling the second lateral recess.

7. The BSI image sensor according to claim 1, wherein the back-end-of-line (BEOL) stack comprises an interlayer dielectric (ILD) layer, and wherein the ILD layer laterally surrounds the T-shaped FDR.

8. The BSI image sensor according to claim 7, wherein the BEOL stack comprises contacts arranged in the ILD layer and extending vertically from the T-shaped FDR.

9. The BSI image sensor according to claim 3, wherein the semiconductor region comprises a bulk semiconductor substrate and a stack of epitaxial layers, and wherein the stack of epitaxial layers accommodates the photodetector.

10. The BSI image sensor according to claim 1, wherein opposing ends of the semiconductor column respectively contact the T-shaped FDR and the photodetector.

11. The BSI image sensor according to claim 3, wherein the photodetector comprises a doped region buried in the semiconductor region, and wherein the semiconductor column extends into the semiconductor region to the doped region.

12. The BSI image sensor according to claim 6, wherein a width of the second semiconductor column is greater than that of the semiconductor column.

13. An integrated circuit (IC) for image sensing, the IC comprising:
   a semiconductor region and a back-end-of-line (BEOL) structure stacked upon one another, wherein the semiconductor region comprises a photodetector;

a pair of semiconductor columns extending from the photodetector, towards the BEOL structure;

a pair of floating diffusion regions (FDRs) spaced from the semiconductor region and correspondingly abutting the semiconductor columns, on opposite ends of the semiconductor columns as the photodetector, wherein widths of the FDRs exceed those of the semiconductor columns;

a pair of gates arranged adjacent to corresponding ones of the semiconductor columns, within corresponding lateral recesses, and between the photodetector and corresponding ones of the FDRs, wherein each of the gates comprises:

a metal gate liner layer confined to a corresponding one of the lateral recesses and lining the corresponding one of the lateral recesses; and a metal gate filler layer filling the corresponding one of the lateral recesses; and an etch stop layer interposed between each of the gates and a lower surface of a corresponding one of the FDRs within a corresponding one of the lateral recesses.

14. The IC according to claim 13, wherein widths of the semiconductor columns are different.

15. The IC according to claim 13, wherein the semiconductor region comprises a bulk semiconductor substrate and a stack of epitaxial layers overlying the bulk semiconductor substrate, wherein the photodetector is arranged in the epitaxial layers and the FDRs are spaced over the epitaxial layers, and wherein the BEOL structure is arranged over the semiconductor region.

* * * * *